United States Patent
Lee et al.

(10) Patent No.: US 9,209,421 B2
(45) Date of Patent: Dec. 8, 2015

(54) ORGANIC LIGHT-EMITTING DEVICE HAVING SPACER PATTERN IN LIGHT EMITTING AREA AND METHOD FOR MANUFACTURING SAME

(71) Applicant: LG CHEM, LTD., Seoul (KR)

(72) Inventors: Jung Hyoung Lee, Daejeon (KR); Minsoo Kang, Daejeon (KR); Ducksu Oh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/355,216

(22) PCT Filed: May 31, 2013

(86) PCT No.: PCT/KR2013/004859
§ 371 (c)(1),
(2) Date: Apr. 30, 2014

(87) PCT Pub. No.: WO2013/180544
PCT Pub. Date: Dec. 5, 2013

(65) Prior Publication Data
US 2014/0306210 A1    Oct. 16, 2014

(30) Foreign Application Priority Data
May 31, 2012    (KR) .................. 10-2012-0058931

(51) Int. Cl.
*H01L 51/52* (2006.01)
*H01L 51/56* (2006.01)
*H01L 51/00* (2006.01)

(52) U.S. Cl.
CPC ........ *H01L 51/5262* (2013.01); *H01L 51/5203* (2013.01); *H01L 51/5212* (2013.01); *H01L 51/56* (2013.01); *H01L 51/0038* (2013.01); *H01L 51/0081* (2013.01); *H01L 51/0085* (2013.01); *H01L 51/0097* (2013.01); *H01L 2251/5392* (2013.01)

(58) Field of Classification Search
None
See application file for complete search history.

(56) References Cited

U.S. PATENT DOCUMENTS

| | | | |
|---|---|---|---|
| 2002/0014836 A1 | 2/2002 | Codama et al. | |
| 2005/0258436 A1 | 11/2005 | Arai | |
| 2006/0226773 A1 | 10/2006 | Kim et al. | |
| 2008/0157661 A1* | 7/2008 | Kajikawa et al. | 313/504 |
| 2011/0073897 A1 | 3/2011 | Kang et al. | |
| 2013/0112962 A1 | 5/2013 | Lee et al. | |
| 2013/0221341 A1* | 8/2013 | Iwabuchi et al. | 257/40 |
| 2015/0041783 A1* | 2/2015 | Ide | H05B 33/04 257/40 |

FOREIGN PATENT DOCUMENTS

| | | |
|---|---|---|
| CN | 102037580 A | 4/2011 |
| JP | 10172765 A | 6/1998 |
| JP | 2002151252 A | 5/2002 |
| JP | 2005332773 A | 12/2005 |
| JP | 2010027210 A | 2/2010 |
| JP | 2012-079419 A | 4/2012 |
| JP | 2012094301 A | 5/2012 |

(Continued)

*Primary Examiner* — Michael Jung
(74) *Attorney, Agent, or Firm* — Dentons US LLP

(57) ABSTRACT

The present invention relates to an organic light emitting device and a method for preparing an organic light emitting device, and the organic light emitting device comprises a substrate, a first electrode, an organic material layer, and a second electrode in this order, and a spacer pattern on the first electrode.

15 Claims, 2 Drawing Sheets

(56) References Cited

FOREIGN PATENT DOCUMENTS

| KR | 2006-0106225 A | 10/2006 |
| KR | 1020100000297 A | 1/2010 |
| KR | 1020110005975 A | 1/2011 |
| KR | 10-2011-0122717 A | 11/2011 |
| KR | 101114351 B1 | 2/2012 |
| WO | 2010/089678 A1 | 8/2010 |
| WO | 2010089678 A1 | 8/2010 |
| WO | 2012005540 A2 | 1/2012 |
| WO | WO 2012/057011 A1 * | 5/2012 ............. H05B 33/26 |

* cited by examiner

ORGANIC LIGHT-EMITTING DEVICE HAVING SPACER PATTERN IN LIGHT EMITTING AREA AND METHOD FOR MANUFACTURING SAME

This application is a 35 USC §371 National Stage entry of International Application No. PCT/KR2013/004859, filed on May 31, 2013, which claims priority of Korean Application No. 10-2012-0058931, filed on May 31, 2012, all of which are hereby incorporated by reference in their entirety.

TECHNICAL FIELD

This application claims priority from Korean Patent Application No. 10-2012-0058931, filed on May 31, 2012 at the KIPO, the disclosure of which is incorporated herein by reference in its entirety.

The present invention relates to an organic light emitting device and a method for preparing the same.

BACKGROUND ART

An organic light emitting device is composed of two opposing electrodes and multilayered organic material thin films having semiconductor-like properties interposed therebetween. The organic light emitting device having the configuration uses a phenomenon in which electric energy is converted into light energy by using an organic material, that is, an organic light emitting phenomenon. Specifically, when voltage is applied between two electrodes in a structure in which an organic material layer is disposed between an anode and a cathode, holes from the anode and electrons from the cathode are injected into the organic material layer. When the injected holes and electrons meet each other, an exciton is formed, and the exciton falls down again to a bottom state to emit light.

In the aforementioned organic light emitting device, the light generated from the organic material layer is emitted through a light transmissive electrode, and the organic light emitting device may be typically classified into a top emission type, a bottom emission type, and a dual emission type. In the case of the top emission or bottom emission type, one of two electrodes needs to be a light transmissive electrode, and in the case of the dual emission type, both the two electrodes need to be a light transmissive electrode.

In respect to the aforementioned organic light emitting device, many studies have been concentrated since Kodak Co., Ltd., announced that when a multilayer structure is used, the device may be driven at low voltage, and recently, a natural color display using the organic light emitting device is attached to a mobile phone and commercialized.

Further, as recent studies on the organic light emitting device using a phosphorescent material instead of an existing fluorescent material have been conducted, efficiency has been rapidly improved, and it is also expected that the device would be able to replace an existing illumination in the near future.

DETAILED DESCRIPTION OF THE INVENTION

Technical Problem

The technical field in the art needs a study on an organic light emitting device which has an excellent light emitting efficiency and is prepared with a simple process and a method for preparing the same.

Technical Solution

The present invention provides an organic light emitting device comprising a substrate, a first electrode, an organic material layer, and a second electrode in this order, and a spacer pattern on the first electrode.

Further, the present invention provides a method for preparing an organic light emitting device comprising: 1) forming a first electrode on a substrate; 2) forming a spacer pattern on the first electrode, and 3) forming an organic material layer and a second electrode.

Advantageous Effects

The organic light emitting device according to an embodiment of the present invention comprises a spacer pattern on the first electrode to prevent the first electrode and the second electrode from being electrically short-circuited by a physical pressure during an encapsulation process using a thin film or a glass without having a cavity. Further, the organic light emitting device according to an embodiment of the present invention adds one time of a photo process which forms a spacer pattern on the first electrode to establish reliability of the substrate.

DESCRIPTION OF MAIN PARTS OF DRAWINGS

Figure 1:
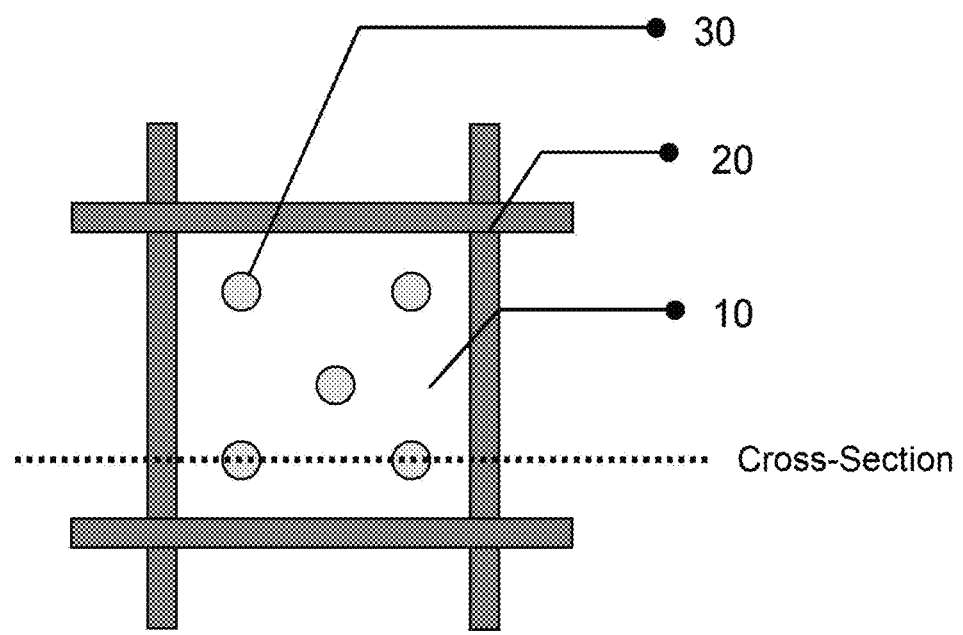
FIG. 1 is a plan view schematically illustrating an organic light emitting device according to a specific embodiment of the present invention.

10: First electrode
20: Auxiliary electrode
30: Spacer
40: Organic material layer
50: Second electrode
60: Insulating layer

BEST MODE

Hereinafter, the present invention will be described in detail.

In order to use an organic light emitting device as illumination, the device needs to be driven at high brightness unlike the existing natural color display, and a constant brightness needs to be maintained like the existing illumination. In order to sufficiently improve the brightness of the organic light emitting device, light emission needs to be implemented in a large area, and in order to implement light emission in the large area, a high driving current needs to be used. In addition, in order to maintain the constant brightness in the large area, the aforementioned high current needs to be uniformly injected into the device having the large area.

Generally, as a anode material of the organic light emitting device, a metal oxide having a large work function is usually used. However, an electric conductivity of the metal oxide is not relatively high. Therefore, when such a metal oxide is used for an organic EL or an LCD having a small display area, there is no problem, but when the metal oxide is used for a large area organic EL used for illumination equipment, a voltage drop due to the high current is so high that the current is not uniformly injected onto a light emitting surface and thus the light emission of the device does not uniformly occur. For example, light is emitted only in the vicinity of a portion in which an electrode is electrically connected to a driving circuit, and weak light emission or no light emission may occur in the other regions.

Meanwhile, as a cathode material of the organic light emitting device, a metal having a small work function or an alloy thereof is usually used. The aforementioned metal may have high electrical conductivity of the material itself, but when transparency of the electrode is required as a characteristic of the organic light emitting device, electrical conductivity is reduced if the metal is formed as a thin film. Therefore, even in this case, since current is not uniformly injected onto a light emitting surface, light emission of the device may not uniformly occur.

As a result, in order to use an organic light emitting device as illumination equipment, it is necessary to allow light emission with high brightness to uniformly occur in a device having a large area by reducing resistance of an electrode.

Generally, the organic light emitting device is composed of two electrodes having a large area which face each other and an organic material layer which is interposed between the two electrodes to emit light by current. The current is applied at an edge of the electrode, flows toward the center of the electrode, passes through an organic material, and is discharged to the other electrode facing the electrode. At this time, a voltage drop occurs in proportion to a resistance of the electrode while the current flows toward the center of the electrode from the edge thereof. Since energy is consumed as much as the voltage drop which occurs due to the resistance of the electrode, energy efficiency of the organic light emitting device is reduced.

Furthermore, since an electric field formed between the two electrodes varies, a light emitting amount of the organic material varies depending on a position of the electrode, and a difference in brightness depending on such a position is not good in terms of appearance and adversely affects stability of the device. Therefore, in the organic light emitting device, a design for minimizing these problems is needed.

A transparent electrode used in the organic light emitting device is transparent so as to allow the light to be transmitted, but has very high electrical resistance compared to a metal electrode. Therefore, when the organic light emitting device is intended to be implemented in a large area, the voltage distribution within the large light emission area is not uniform due to the high electrical resistance of the transparent electrode, and accordingly, there is a problem in obtaining light emission with uniform brightness in a large area. A method generally used in order to solve the problem is to install an auxiliary electrode using a metal on or under the transparent electrode. A metal auxiliary electrode is prepared with a lattice shape as thin as possible in order to secure transparency, and a method of increasing the cycle of the lattice as long as possible is used in order to increase transparency while obtaining a uniform voltage distribution in a large area. However, the method of using a metal auxiliary electrode with a lattice shape has not only a problem in that complexity of the process increases, but also a process problem in that when an auxiliary electrode is formed on a transparent electrode, it is to uniformly stack an organic material to be configured on the auxiliary electrode due to the height thereof.

When preparing an organic light emitting device, a thin film or a glass without having a cavity is used in an encapsulation process. However, in the encapsulation process using the thin film or the glass without having a cavity, the organic light emitting device is encapsulated by a physical pressure so that the first and second electrodes of the organic light emitting device are in contact with each other in some cases. As described above, when the first and second electrodes of the organic light emitting device are in contact with each other, an electrical short may occur and thus defects may occur in the entire organic light emitting device.

Therefore, the present invention has been made in an effort to provide an organic light emitting device which may prevent the first electrode and the second electrode of the organic light emitting device from being electrically short circuited even in the encapsulation process by the physical pressure.

An organic light emitting device according to an embodiment of the present invention comprises a substrate, a first electrode, an organic material layer, and a second electrode in this order, and a spacer pattern on the first electrode.

The organic light emitting device according to the present invention comprises a light emitting area and a non-light emitting area and the spacer pattern may be provided in the light emitting area of the organic light emitting device. Here, the spacer pattern may be provided between the first electrode and the organic material layer.

A taper angle of the spacer pattern may exceed 10° and be under 60°, but the invention is not limited thereto.

The spacer pattern may be formed using a photosensitive resin composition which is known in the art. More specifically, the spacer pattern may be formed using a photosensitive resin composition containing polyimide but the invention is not limited thereto.

A method of preparing the spacer pattern is as follows.

The photosensitive resin composition is coated on the first electrode using a spray method, a roll coating method, an application method using a slit nozzle, a rotational application method, an extrusion coating method, and a bar coating method or a combination of at least two of them.

After forming a dry paint film, in order to form a dry paint film without having a liquidity, a process of volatilizing a solvent by applying a vacuum and/or heat may be performed.

Even though a heating condition may vary depending on a type of the components or a mixing ratio, in the case of heating a thermal plate, the photosensitive resin composition may be heated at 60 to 130° C. for 5 to 500 seconds and also may be heated in a thermal oven at 60 to 140° C. for 20 to 1,000 seconds. But the invention is not limited thereto.

Next, radiation is irradiated onto the dry paint film in which the solvent is volatized so that the liquidity is reduced using a mask with a predetermined pattern. The exposure amount, an exposure condition, or a type of radiation may vary depending on a resolution or a mixing degree of a composition. In this invention, as a radiation, an ultraviolet ray such as a g-ray (a wavelength is 436 nm), an I-ray (a wavelength is 365 nm), an h-ray (a wavelength is 405 nm), a far-ultraviolet ray such as excimer laser (krF, ArF), an X-ray such as synchrotron radiation, and a charged particle radiation such as an electron beam may be used and the I-ray, h-ray, or g-ray may be also used. The exposure may be performed using a contact, proximate, or projection exposure method.

A post exposure baking (PEB) process may be performed if necessary after performing the exposure and before performing an alkaline development. A temperature of the PEB is 150° C. or lower and the time may be approximately 0.1 to 10 minutes.

A development process is a process which removes an undesired portion using an alkaline developer and may be performed such that a non-exposed portion is removed using an aqueous alkaline developer. As the developer, for example, an alkaline aqueous solution selected from inorganic alkalis such as sodium hydroxide, potassium hydroxide, sodium carbonate, sodium silicate, meta sodium silicate, ammonia, or water; primary amines such as ethyl amine or n-propyl amine; secondary amines such as diethyl amine or n-propyl amine, tertiary amines such as triethylamine, methyldiethyl amine, or n-methyl pyrrolidone; alcohol amines such as dimethylethyl alcohol amine or triethyl alcohol amine; quaternary ammonium salts such as tetra methyl ammonium hydroxide, tetraethyl ammonium hydroxide or choline; and amines such as pyrol or piperidine may be used. Further, an aqueous solution obtained by adding an appropriate amount of an aqueous organic solvent such as methyl alcohol, ethyl alcohol, propyl alcohol, isopropyl alcohol, propylene glycol monomethyl ether, dipropylene glycol or monomethyl ether or surfactant into the alkaline aqueous solution may be used as the developer. The development time may be approximately 15 to 200 seconds and the developing method may be all of a dipping method, a spraying method, or a puddle method. After performing the development process, a washing process is performed using pure water for 20 to 200 seconds and then moisture on the substrate may be removed using compressed air or nitrogen. Through the above method, the spacer pattern may be formed on the first electrode.

Next, a post baking process may be performed using a heating device such as a thermal plate or an oven. The baking process may be performed at 150° C. to 250° C. for 5 to 60 minutes using the thermal plate or for 15 to 90 minutes using the oven. After finally completing the baking process, a spacer pattern which is completely hardened by crosslinking may be obtained.

In the organic light emitting device according to the present invention, a thickness of the spacer pattern may be 1 to 2 µm and a diameter thereof may be 10 to 50 µm, but the invention is not limited thereto.

Further, a region where the spacer pattern is provided is a non-light emitting area so that an area of the region where the spacer pattern is provided is preferably 3 to 10% of an area of the light emitting area of the organic light emitting device.

As described above, when the area of the region where the spacer pattern is provided is 3 to 10%, it is possible to prevent the first electrode and the second electrode from being short circuited during the encapsulation process by the physical pressure without significantly lowering the light emitting property of the organic light emitting device.

In the organic light emitting device according to the present invention, those known in the art may be used as the substrate without limitation. More specifically, a hard substrate such as glass, $SiO_2$, and a silicon wafer, or a film substrate such as polyethylene terephthalate (PET), polycarbonate (PC), polyimide (PI), polyethylene naphthalate (PEN), and cycloolefin polymer (COP) may be used, but the substrate is not limited thereto.

In the organic light emitting device according to the present invention, the first electrode may be a transparent electrode. More specifically, the first electrode may comprise a transparent conductive material such as indium tin oxide (ITO), IZO, ZnO, and $SnO_2$, but is not limited thereto.

The first electrode may be formed by depositing a metal, a metal oxide having conductivity, an alloy thereof, and the like on a substrate using a physical vapor deposition (PVD) method such as sputtering or e-beam evaporation.

In the organic light emitting device according to the present invention, the second electrode may be a metal electrode. The metal may comprise at least one of Al, Ag, Ca, Mg, Au, Mo, Ir, Cr, Ti, Pd, and an alloy thereof, but is not limited thereto.

In the organic light emitting device according to the present invention, an auxiliary electrode may be additionally comprised on the first electrode. The auxiliary electrode is for improving the resistance of the first electrode, and may be formed by depositing one or more selected from the group consisting of a conductive sealant and a metal. More specifically, the auxiliary electrode may comprise Cr, Mo, Al, Cu, or an alloy thereof, but is not limited thereto.

The organic light emitting device according to the present invention comprises a light emitting area and a non-light emitting area and the auxiliary electrode may be comprised in the non-light emitting area.

In the organic light emitting device according to the present invention, an insulating layer may be additionally comprised on the first electrode. The insulating layer may serve as a pixel division in the organic light emitting device having a large area and may be formed using materials and methods known in the art.

The auxiliary electrode may be provided on the first electrode and the insulating layer may be provided on the auxiliary electrode.

In the organic light emitting device according to the present invention, the spacer pattern may be provided in the light emitting area of the organic light emitting device and the auxiliary electrode may be provided in the non-light emitting area of the organic light emitting device. When the spacer pattern is comprised in the light emitting area of the organic light emitting device, a height of the spacer pattern of the light emitting area may be formed to be equal to the height of the non-light emitting area.

As described above, when the height of the spacer pattern of the light emitting area of the organic light emitting device is formed to be equal to the height of the non-light emitting area, it is possible to prevent the first electrode and the second electrode from being electrically short circuited during the encapsulation process by the physical pressure.

The organic light emitting device according to the present invention may be applied to an organic light emitting device for illumination, but is not limited thereto.

In the organic light emitting device according to the embodiment of the present invention, the organic material layer may be prepared in the smaller number of layers by not only a deposition method using various polymer materials and but also methods such as a solvent process, for example, spin coating, dip coating, doctor blading, screen printing, inkjet printing, a heat transferring method and the like.

The organic material layer may have a laminate structure that comprises a light emitting layer, and further comprises one or more selected from a hole injection layer, a hole transport layer, an electron transport layer, and an electron injection layer.

As a material capable of forming the hole injection layer, generally, a material having a large work function is preferred such that the injection of holes into the organic material layer may be facilitated. As detailed examples of the hole injection material that can be used in the present invention, there are metal such as vanadium, chrome, copper, zinc, and gold or an alloy thereof; metal oxides such as zinc oxides, indium oxides, indium tin oxides (ITO), and indium zinc oxides (IZO); a combination of metal and oxides such as ZnO:Al or $SnO_2$:Sb; and conductive polymers such as poly(3-methylthiophene), poly[3,4-(ethylene-1,2-dioxy)thiophene] (PEDT), polypyrrole, and polyaniline, but are not limited thereto. As a material capable of forming the electron injection layer, a material having a small work function is preferred such that electrons are easily injected into the general organic material layer. As detailed examples of the electron injection material, there are metal such as magnesium, calcium, sodium, potassium, titanium, indium, yttrium, lithium, gadolinium, aluminum, silver, tin, and lead or an alloy thereof; and a multilayered structure material such as LiF/Al or $LiO_2$/Al, and the same material as the hole injection electrode material may also be used, but they are not limited thereto.

A material capable of forming the light emitting layer is a material that is capable of emitting light in a visible ray region by accepting and combining holes from the hole transport layer and electrons from the electron transport layer, respectively, and is preferably a material having high quantum efficiency for fluorescence and phosphorescence. As detailed examples thereof, there are a 8-hydroxy-quinoline aluminum complex ($Alq_3$); a carbazole-based compound; a dimerized styryl compound; BAlq; 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene; and phosphorescent host CBP [[4,4'-bis(9-carbazolyl)biphenyl], but they are not limited thereto.

In addition, the light emitting material may further comprise a phosphorescent dopant or a fluorescent dopant in order to improve fluorescent or phosphorescent characteristics. As detailed examples of the phosphorescent dopant, there are ir(ppy)(3)(fac tris(2-phenylpyridine) iridium) or F2Irpic[iridium(III)bis[4,6,-di-fluorophenyl-pyridinato-N, C2) picolinate]. As the fluorescent dopant, materials known in the art may be used.

As a material capable of forming the electron transport layer, a material which may receive electrons from the electron injection layer well and transport the electrons to the light emitting layer and has high mobility to electrons is suitable. Specific examples thereof comprise a 8-hydroxyquinoline Al complex; a complex comprising $Alq_3$; an organic radical compound; a hydroxyflavone-metal complex, and the like, but are not limited thereto.

The organic light emitting device according to the present invention comprises a spacer pattern on the first electrode to prevent electric short of the first electrode and the second electrode by a physical pressure during an encapsulation process using a thin film or a glass without having a cavity. Further, the organic light emitting device according to the present invention adds one time of a photo process which forms a spacer pattern on the first electrode to establish reliability of the substrate.

A specific example of the method for preparing an organic light emitting device according to the present invention comprises 1) forming a first electrode on a substrate; 2} forming a spacer pattern on the first electrode 3) forming an organic material layer and a second electrode.

In the method for preparing an organic light emitting device according to the present invention, the materials and preparing methods of the substrate, the first electrode, the spacer pattern, the organic material layer, and the second electrode have been described in the above so that the detailed description thereof will be omitted.

The method for preparing an organic light emitting device according to the present invention may further comprise, before or after forming the spacer pattern in step 2, forming an auxiliary electrode on the first electrode.

The method for preparing an organic light emitting element according to the present invention may further comprise forming an insulating layer on the auxiliary electrode.

Hereinafter, the present invention will be described in detail with reference to the drawings.

Figure 2:
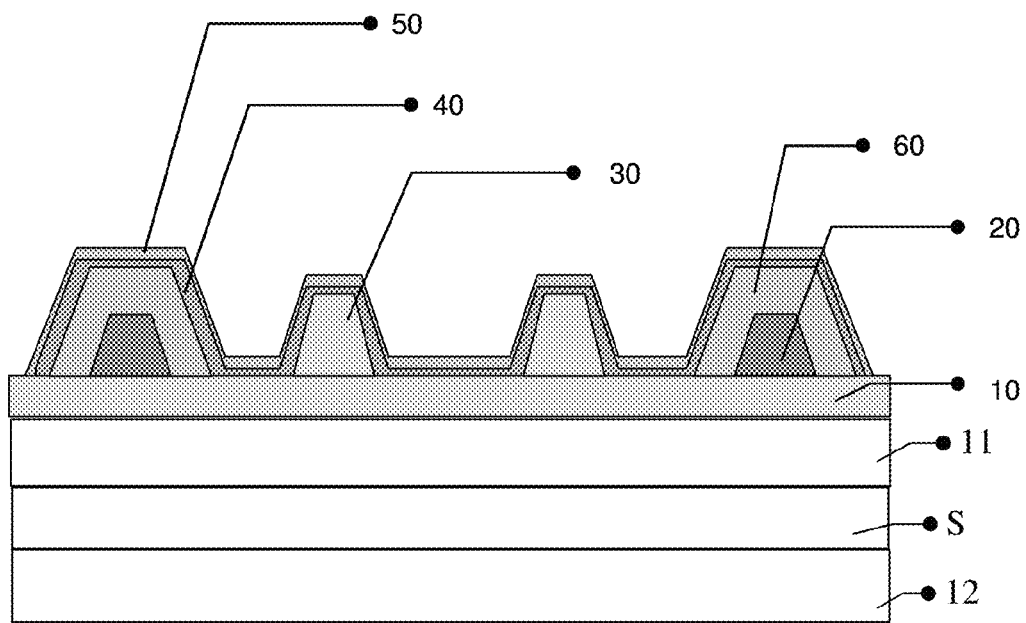
FIG. 2 is a vertical cross-sectional view schematically illustrating an organic light emitting device according to a specific embodiment of the present invention.

FIGS. 1 and 2 are drawings schematically illustrating a plane and a vertical cross-section of the organic light emitting device according to a specific example of the present invention.

FIG. 1 is a plan view schematically illustrating an organic light emitting device with a spacer 30 which is formed on a first electrode 10. An auxiliary electrode 20 may be formed on the first electrode 10.

FIG. 2 illustrates a vertical structure of a cross-section represented by a dotted line in FIG. 1. The organic light emitting device of FIG. 2 comprises the first electrode 10, an organic material layer 40, and a second electrode 50 in this order and a pattern of the spacer 30 may be provided on the first electrode 10. The auxiliary electrode 20 may be provided on the first electrode 10 and an insulating layer 60 may be provided on the auxiliary electrode 20.

The organic light emitting device according to the present invention may comprise a light extraction structure.

In the present invention, the organic light emitting device may optionally further comprise an internal light extraction layer 11 between the substrate S and the first electrode 10. Further, the organic light emitting device may optionally further comprise an external light extraction layer 12 on a surface opposing to a surface of the substrate S on which the first electrode 10 is provided.

In the present invention, the internal light extraction layer or the external light extraction layer is not particularly limited as long as the layer has a structure in which light scattering may be induced so as to improve the light extraction efficiency of the organic light emitting device. More specifically, the light extraction layer may have a structure in which scattering particles are dispersed in a binder.

In addition, the light extraction layer may be directly formed on the base member by a method such as spin coating, bar coating, slit coating, and the like, or may be formed by a method of preparing the layer in a film form to be attached on the base member.

In the present invention, the organic light emitting device is a flexible organic light emitting device. In this case, the base member comprises a flexible material. For example, it is possible to use glass having a flexible thin film form, and a substrate having a plastic or film form.

A material of the plastic substrate is not particularly limited, but generally, a film of PET, PEN, PI, and the like may be used in the form of a single layer or plural layers.

Furthermore, the present invention provides a display apparatus comprising the organic light emitting device.

Further, the present invention provides an illumination apparatus comprising the organic light emitting device.

As described above, the organic light emitting device according to an embodiment of the present invention comprises a spacer pattern on the first electrode to prevent the first electrode and the second electrode from being electrically short-circuited by a physical pressure during an encapsulation process using a thin film or a glass without having a cavity. Further, the organic light emitting device according to an embodiment of the present invention adds one time of a photo process which forms a spacer pattern on the first electrode to establish reliability of the substrate.

The invention claimed is:
1. An organic light emitting device, comprising:
a substrate, a first electrode, an organic material layer, and a second electrode in this order,
a spacer pattern formed using a photosensitive resin composition on the first electrode,
a metal auxiliary electrode with a lattice shape on the first electrode, and
an insulating layer on the metal auxiliary electrode,
wherein the organic light emitting device comprises a light emitting area and a non-light emitting area, and the spacer pattern is provided in the light emitting area but not provided in the non-light emitting area of the organic light emitting device, and the metal auxiliary electrode is provided in the non-light emitting area but not provided in the light emitting area of the organic light emitting device.

2. The organic light emitting device of claim 1, wherein the spacer pattern is provided between the first electrode and the organic material layer.

3. The organic light emitting device of claim 1, wherein a taper angle of the spacer pattern exceeds 10° and is under 90°.

4. The organic light emitting device of claim 1, wherein a thickness of the spacer pattern is 1 to 2 µm.

5. The organic light emitting device of claim 1, wherein a diameter of the spacer pattern is 10 to 50 µm.

6. The organic light emitting device of claim 1, wherein an area of a region where the spacer pattern is provided is 3 to 10% of an area of the light emitting area of the organic light emitting device.

7. The organic light emitting device of claim 1, wherein the substrate is selected from a group consisting of glass, $SiO_2$, a silicon wafer, polyethylene terephthalate (PET), polycarbonate (PC), polyimide (PI), polyethylene naphthalate (PEN), and cycloolefin polymer (COP).

8. The organic light emitting device of claim 1, wherein the first electrode comprises one or more selected from a group consisting of indium tin oxide (ITO), IZO, ZnO, and $SnO_2$.

9. The organic light emitting device of claim 1, wherein the metal auxiliary electrode comprises one or more selected from a group consisting of Cr, Mo, Al, Cu, and an alloy thereof.

10. The organic light emitting device of claim 1, wherein the second electrode comprises one or more selected from a group consisting of Al, Ag, Ca, Mg, Au, Mo, Ir, Cr, Ti, Pd, and an alloy thereof.

11. The organic light emitting device of claim 1, further comprising:
   an internal light extraction layer between the substrate and the first electrode, or
   an exterior light extraction layer on a surface opposing to a surface of the substrate on which the first electrode is provided.

12. The organic light emitting device of claim 1, wherein the organic light emitting device is a flexible organic light emitting device.

13. A display device comprising an organic light emitting device of claim 1.

14. An illumination apparatus comprising an organic light emitting device of claim 1.

15. A method of preparing an organic light emitting device, comprising:
   1) forming a first electrode on a substrate;
   2) forming a spacer pattern formed using a photosensitive resin composition on the first electrode,
   3) forming an organic material layer and a second electrode,
   4) forming a metal auxiliary electrode with a lattice shape on the first electrode, and
   5) forming an insulating layer on the metal auxiliary electrode;
   wherein the organic light emitting device comprises a light emitting area and a non-light emitting area, and the spacer pattern is provided in the light emitting area but not provided in the non-light emitting area of the organic light emitting device, and the metal auxiliary electrode is provided in the non-light emitting area but not in the light emitting area of the organic light emitting device.

* * * * *